United States Patent [19]

Davis

[11] Patent Number: 5,695,877

[45] Date of Patent: Dec. 9, 1997

[54] DOPED FERRITE FILM

[75] Inventor: James Lynn Davis, Parkland, Fla.

[73] Assignee: Motorola, Inc., Schaumburg, Ill.

[21] Appl. No.: 695,541

[22] Filed: Aug. 12, 1996

Related U.S. Application Data

[60] Continuation of Ser. No. 498,866, Jul. 6, 1995, abandoned, which is a division of Ser. No. 314,102, Sep. 28, 1994, Pat. No. 5,460,704.

[51] Int. Cl.⁶ .................................................. B32B 5/16
[52] U.S. Cl. ................ 428/329; 428/336; 428/692; 428/694 T; 428/694 TM; 428/697; 428/701; 428/900; 428/941
[58] Field of Search ...................... 428/65.3, 692, 428/694 T, 697, 900, 941, 329, 336, 328, 201, 694 TM

[56] References Cited

U.S. PATENT DOCUMENTS

| | | | |
|---|---|---|---|
| 4,083,709 | 4/1978 | Reade | 65/32 |
| 4,232,061 | 11/1980 | Hattori et al. | 427/130 |
| 4,642,245 | 2/1987 | Ishii et al. | 427/47 |
| 4,717,584 | 1/1988 | Aoki et al. | 427/38 |
| 4,865,658 | 9/1989 | Kudo | 148/121 |
| 4,975,324 | 12/1990 | Torii et al. | 428/329 |
| 5,049,454 | 9/1991 | Johnson et al. | 428/692 |
| 5,294,312 | 3/1994 | Chin et al. | 204/192.2 |
| 5,320,881 | 6/1994 | Vittoria | 427/596 |
| 5,521,017 | 5/1996 | Yanagisawa et al. | 428/626 |
| 5,580,671 | 12/1996 | Tamari et al. | 428/694 T |

FOREIGN PATENT DOCUMENTS 2 202 866  10/1988  United Kingdom.

OTHER PUBLICATIONS

"Ferrite Thin Films for Microwave Applications," Zaquine, H. Banazizi, Mage, J.C., Journal Applied Physics 64(10), 15 Nov. 1988, pp. 5B22–5B24, American Institute of Physics.

"Microwave Characterization of Microstrip Lines and Spiral Inductors in MCM–D Technology," Arnold, R.G., Pedder, D.J., IEEE Transactions on Components, Hybrids, and Manufacturing Technology, vol. 15, No. 6, Dec. 1992, pp. 1038–1045.

*Primary Examiner*—Stevan A. Resan
*Attorney, Agent, or Firm*—Dale W. Dorinski

[57] ABSTRACT

Ferrite films are formed by reactively sputtering elemental iron in an oxygen-containing plasma to deposit a layer of iron oxide (14) on a ceramic substrate (12). A dopant layer (16) of a transition metal-oxide is reactively sputtered onto the iron oxide layer from a target of a transition metal, such as nickel or zinc, using an oxygen-containing plasma. The substrate, the layer of iron oxide and the dopant layer are all heated under conditions sufficient to diffuse the dopant layer into the layer of iron oxide, thereby forming a doped ferrite thin film (20). The resulting doped ferrite film can be $FeFe_2O_4$, $NiFe_2O_4$, $(NiZn)Fe_2O_4$, or $ZnFe_2O_4$.

10 Claims, 1 Drawing Sheet

DOPED FERRITE FILM

This is a continuation of application Ser. No. 08/498,866, filed Jul. 6, 1995, and now abandoned, which was a divisional of U.S. Ser. No. 314,108, filed Sep. 28, 1994, now U.S. Pat. No. 5,460,704 issued Oct. 24, 1995.

TECHNICAL FIELD

This invention relates in general to thin films, and more particularly to ferrite thin films.

BACKGROUND

Ferrite materials are commonly used in electronic devices to enhance the performance of components such as transformers and inductors. In many applications, pressed and sintered ferrite ceramics such as $FE_3O_4$, $NiFe_2O_4$, $MgFe_2O_4$, and $(NiZn)Fe_2O_4$ are used as blocks around which transformers or inductors are wound. At low frequencies, the magnetic loss tangents of these materials are adequate, and hence, polycrystalline pressed powdered material are sufficient. However, in high frequency applications such as microwave filters and resonators, the losses become very high and hence single crystalline materials must be used. Miniaturization and integration of components for use in radio frequency electronics require that methods be found to deposit thin films of ferrites. There are a number of challenges in this process: (1) very few materials possess low loss at high frequencies, (2) depositing magnetic materials is difficult using a high rate source such as a magnetron, and (8) the deposited films may need to have widely varying thicknesses. These requirements have limited the development of ferrite technology in microelectronics, and therefore, a novel solution to these problems is needed.

SUMMARY OF THE INVENTION

Figure 1:
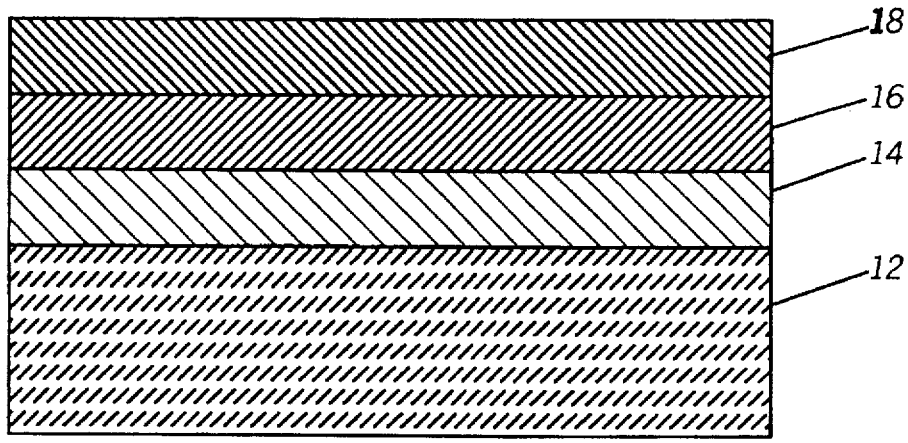
FIG. 1 is a cross-sectional schematic view of a thin film ferrite as deposited on a substrate in accordance with invention. The sizes of the elements are not to scale.

Briefly, according to the invention, there is provided a method of forming ferrite films by sputtering elemental iron in an oxygen-containing reactive plasma to deposit a layer of iron oxide on a substrate. A dopant layer is sputtered onto the iron oxide layer by sputtering a metal in an oxygen-containing reactive plasma, so that the dopant layer is deposited as a metal-oxide. The substrate, the layer of iron oxide and the dopant layer are all heated under conditions sufficient to diffuse the dopant layer into the layer of iron oxide, thereby forming a doped ferrite thin film.

In an alternate embodiment of the invention, the ferrite film is deposited onto an alumina ceramic substrate, and the dopant material is nickel or zinc, and is diffused into the thin film of ferrite by annealing at a temperature greater than 500° C. The resulting doped ferrite film is $FeFe_2O_4$, $NiFe_2O_4$, $(NiZn)Fe_2O_4$, or $ZnFe_2O_4$.

DETAILED DESCRIPTION OF THE PREFERRED EMBODIMENT

Novel ferrite thin films in accordance with the invention are made using a three step process consisting of:

(1) deposition of an iron oxide film on a substrate such as alumina, (2) deposition of one or more metal oxide films on top of the iron oxide layer to serve as dopants, and (3) annealing the substrate to drive the dopants into the iron oxide crystal lattice.

The films were formed by using sputtering process and equipment. Those smiled in the art of sputtering as a method of vacuum depositing very thin films will appreciate that the terms used in the following description are well known in the art, and need no additional explanation. The deposition was performed using a sputter, magnetron source housed in a vacuum chamber. The magnetron source was configured such that its internal magnetic field was unbalanced, i.e., the magnetic flux from the source radiated far into the vacuum chamber. This process facilitates the deposition of magnetic materials such as Fe and Ni, which are difficult to sputter with a conventional magnetron source since the inherent magnetism of the target interferes with operation of the magnetron. The vacuum chamber has separate gas lines for admitting controlled amounts of argon and oxygen gases to the vacuum chamber.

A substrate such as alumina, aluminum nitride, or barium titanate is placed into the vacuum chamber and the chamber is evacuated to $1 \times 10^{-6}$ Torr. Upon reaching the chamber base pressure, a gaseous atmosphere of between $5 \times 10^{-3}$ and $20 \times 10^{-3}$ Torr total pressure was introduced into the chamber. The oxygen content of the plasma varied between 10% and 60%, with a preferred range of 15–30% for iron oxide deposition. The remainder of the admitted gas was Ar. A layer of iron oxide can then be deposited on the substrate using direct current (DC) sputtering from a target consisting of elemental iron while the substrate is in the oxygen-containing reactive plasma. Typically, the sputter magnetron source was operated at 200–400 Watts in the constant power mode. The sputtering operation was continued until a sufficient thickness, as measured by a quartz crystal oscillator, was achieved. The film deposited in this way was later identified as $Fe_2O_3$ using x-ray diffraction (XRD) and x-ray photoelectron spectroscopy (XPS).

This iron oxide film can now be modified or 'doped' with other additives to form a doped ferrite film. In order to create this effect, one or more layers or films of dopant metal oxides are deposited on top of the $Fe_2O_3$ thin film that was described above. Metal oxides such as cobalt oxide, chromium oxide, copper oxide, iron oxide, lithium oxide, magnesium oxide, manganese oxide, nickel oxide, titanium oxide, vanadium oxide, yttrium oxide, and zinc oxide are useful as additives to dope the iron oxide film. The process used to deposit the layer(s) of dopant metal oxides on top of the iron oxide layer was similar to that previously described for the $Fe_2O_3$ deposition. The dopant metal oxides were deposited from appropriate targets of the elemental metal using DC sputtering in an oxygen-containing reactive plasma. Typically, the background gas pressure during sputtering was $5 \times 10^{-3}$ and $20 \times 10^{-3}$ Torr, and the gas composition was 10–60% $O_2$ with the remainder Ar. The sputter magnetron source was operated at 200–400 Watts in the constant power mode. The formation of metal oxides using this sputtering method was confirmed with both x-ray diffraction and x-ray photoelectron spectroscopy. For example, using this technique, zinc oxide films can be deposited on top of the iron oxide layer from elemental Zn targets, and NiO films could be deposited using elemental Ni targets. The thickness of these metal oxide dopant films was determined by the density of the film and the amount of dopant required to achieve the desired stoichiometry in the doped ferrite film.

Upon deposition of the iron oxide and dopant oxide layers, the desired ferrite composition is synthesized by annealing the substrate containing the deposited films. The annealing process diffused the dopant metal oxides into the iron oxide lattice and created a ferrite film with properties distinctive from the starting materials. This reaction was followed using both depth profiling Auger and x-ray diffraction. Depending upon the type of ferrite properties required, annealing temperatures of 500°–750° C. were employed. Annealing at 500°–600° C. was found to produce a ferrite with a surface enrichment of the dopant metal oxides. Annealing at 700° C. produced a uniform distribution of the metal oxide dopant throughout the iron oxide lattice. The annealing time varied from 1–36 hours depending upon the desired properties of the product film. Homogeneous distribution of the dopant metal oxides requires 12–36 hours of annealing, while non-homogeneous distributions required shorter times. Hence, the composition and properties of the ferrite film can now be controlled by a combination of annealing temperature and annealing time.

The following examples are provided to further illustrate the practice of the invention, and are by way of example and not by way of limitation.

Example 1

An alumina ceramic substrate was placed into the vacuum chamber and coated with 1000 Angstroms (Å) of $Fe_2O_3$. The $Fe_2O_3$ film was deposited from an elemental Fe target using DC sputtering at a constant 250 Watts. The oxygen-containing reactive plasma used to deposit the $Fe_2O_3$ consisted $5 \times 10^{-3}$ Torr Ar and $1 \times 10^{-3}$ Torr $O_2$. The formation of $Fe_2O_3$ was confirmed with x-ray photoelectron spectroscopy analysis of the film (immediately after deposition and prior to exposure to air) and x-ray diffraction. On top of the $Fe_2O_3$ layer was deposited 500 Å of ZnO. The ZnO film was deposited from a metallic Zn target operating at a constant 250 Watts. The plasma used to deposited the ZnO film contained $4 \times 10^{-3}$ Torr Ar and $4 \times 10^{-3}$ Torr $O_2$. Deposition of ZnO films was confirmed by x-ray photoelectron spectroscopy. Depth profile Auger analysis revealed that the deposited film contained separate and distinctive layers of $Fe_2O_3$ and ZnO.

Example 2

The film described in Example 1 was annealed in air at 750° C. for 12 hours. After the annealing process, the x-ray diffraction pattern obtained from the sample was in excellent agreement with literature values for zinc ferrite $ZnFe_2O_4$. Depth profile Auger analysis revealed that this film contained a homogeneous distribution of ZnO throughout the iron oxide lattice, confirming formation of zinc ferrite.

Example 3

To an alumina substrate, 1000 Å of $Fe_2O_3$ was sputter deposited from an elemental Fe target using the procedures described in Example 1. To this, 400 Å of NiO were deposited from a metallic Ni target in a reactive gas plasma containing $O_2$. The sputtering source was operated at a constant 250 Watts DC for Ni deposition, and the plasma consisted of $4 \times 10^{-3}$ Torr Ar and $2 \times 10^{-3}$ Torr $O_2$. The film deposited in this way was confirmed to be NiO by x-ray photoelectron spectroscopy and x-ray diffraction. Depth profile Auger analysis of this sample revealed that it contained separate and distinctive layers of NiO and $Fe_2O_3$, prior to annealing.

Example 4

The film described above in Example 3 was annealed at 750° C. for 18 hours. After the annealing process, the x-ray diffraction pattern obtained from the sample was in excellent agreement with literature values for nickel ferrite $NiFe_2O_4$. Depth profile Auger analysis revealed that this film contained a homogeneous distribution of NiO throughout the iron oxide lattice.

Example 5

Figure 2:
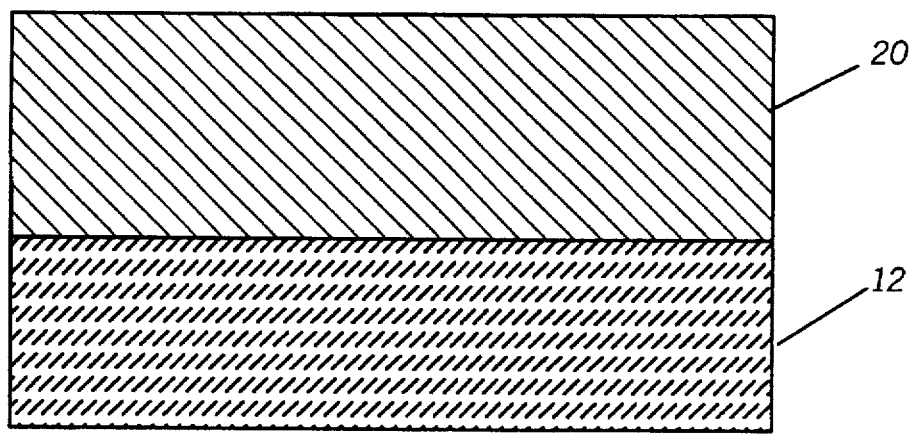
FIG. 2 is a cross-sectional schematic view of the thin film ferrite of FIG. 1 after heat treating.

Referring now to FIG. 1, an alumina substrate (12) was coated with 1050 Å $Fe_2O_3$, 400 Å NiO, and 250 Å ZnO in sequence using elemental targets, DC sputtering, and a reactive oxygen-containing plasma as described above. Depth profiles of the unannealed film revealed the presence of separate and distinctive layers of $Fe_2O_3$ (14), NiO (16), and ZnO (18). Annealing the film at 750° C. for 12 hours modified the structure of FIG. 1 to produce a structure similar to that shown in FIG. 2, where a nickel zinc ferrite $(NiZn)Fe_2O_4$ layer (20) is uniformly doped with Ni and Zn.

Example 6

A ferrite film was synthesized on an alumina substrate by deposited sequential layers of 10050 Å $Fe_2O_3$, 4120 Å NiO, and 500 Å ZnO. All metal oxide films were deposited using elemental metal targets and DC sputtering in a reactive gas plasma containing $O_2$, as described above. The deposited film was annealed at 750° C. for 36 hours. X-ray diffraction analysis of the film confirmed the formation of nickel zinc ferrite $(NiZn)Fe_2O_4$.

Example 7

A ferrite film was synthesized by first depositing 1000 Å of $Fe_2O_3$ on alumina followed by 500 Å of NiO. The film was annealed at 600 C. for 12 hours. Examination of the film revealed that it contained proportionally more nickel ferrite $NiFe_2O_4$ at the surface and more magnetite $FeFe_2O_4$ in the bulk. This example shows that non homogeneous distribution of the dopant metal oxides can be achieved with the proper control of annealing time and temperature.

Example 8

An alumina substrate was coated with 1050 Å of NiO deposited from an elemental Ni target in an oxygen-containing plasma as described in Example 3. On top of this layer was deposited 2800 Å of $Fe_2O_3$ using DC sputtering from an elemental iron target and an oxygen-containing plasma. Annealing the substrate at 750 C. for 20 hours did not result in synthesis of a ferrite. Depth profile Auger studies of the film revealed that the NiO layer diffused into the alumina and not into the iron oxide film. Hence, ferrite formation did not occur.

While the preferred embodiments of the invention have now been illustrated and described, it is to be understood that the invention is not so limited. For example, the dopant materials can be deposited simultaneously rather than in layers, in a co-deposition step. The layering structure can be further modified with one or more additional layers of iron oxide on the dopant layer, and the annealing steps can be rearranged and modified to provide preferential doping of certain layers. It is clear that the instant invention provides novel thin ferrite films that have well defined structure and properties. These films are found to be useful in forming miniature or micro-miniature electronic components heretofore unattainable. Numerous other applications, modifications, changes, variations, substitutions and equivalents will occur to those skilled in the art without departing from the spirit and scope of the present invention as defined by the appended claims.

What is claimed is:

1. A ferrite thin film having a layered structure, comprising:
   a base layer consisting of $Fe_2O_3$;
   a first dopant layer of one or more oxides of a metal deposited on the base layer, said metal selected from the group consisting of Co, Cu, Fe, Li, Mg, Mn, Ni, Ti, V, Y, and Zn; and
   a second dopant layer, deposited on the first dopant layer and differing in chemical composition from the first dopant layer, of one or more oxides of a metal selected from the group consisting of Co, Cu, Fe, Li, Mg, Mn, Ni, Ti, V, Y, and Zn.

2. The ferrite thin film of claim 1, wherein the base layer, the first dopant layer and the second dopant layer are each less than 2000 Å.

3. The ferrite thin film of claim 2, wherein the first dopant layer is NiO and the second dopant layer is ZnO.

4. A doped ferrite thin film, comprising $(NiZn)Fe_2O_4$ uniformly doped with Ni and Zn.

5. A doped ferrite thin film, comprising $Fe_2O_3$ and $(M)Fe_2O_4$ wherein M is one or more metals selected from the group consisting of Co, Cu, Fe, Li, Mg, Mn, Ni, Ti, V, Y, and Zn and wherein the $(M)Fe_2O_4$ is preferentially disposed near the surface of the ferrite thin film.

6. A doped ferrite thin film, comprising $(M_a)F_2O_4$ and $(M_b)Fe_2O_4$ wherein $M_a$ and $M_b$ are selected from the group consisting of Co, Cu, Fe, Li, Mg, Mn, Ni, Ti, V, Y, and Zn, and wherein $(M_a)Fe_2O_4$ is preferentially distributed near the surface of the doped ferrite thin film, and $(M_b)Fe_2O_4$ is preferentially distributed below the $(M_a)Fe_2O_4$.

7. The doped ferrite thin film of claim 6, wherein $(M_a)Fe_2O_4$ is $NiFe_2O_4$.

8. The doped ferrite thin film of claim 7, wherein $(M_b)Fe_2O_4$ is $ZnFe_2O_4$.

9. The doped ferrite thin film of claim 6, wherein the $(M_b)Fe_2O_4$ is $ZnFe_2O_4$.

10. The doped ferrite thin film of claim 6, wherein the doped ferrite thin film is less than 10,000 Å.

* * * * *